(12) United States Patent
Douglas et al.

(10) Patent No.: US 6,411,108 B1
(45) Date of Patent: *Jun. 25, 2002

(54) NONCONTACT SIGNAL ANALYZER (75) Inventors: Philip Douglas, Clayton; Alan G. Johnson, Raleigh; Brent Beamer, Cary, all of NC (US)

(73) Assignee: Sensor Technologies, Inc., Durham, NC (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 24 days.

(21) Appl. No.: 09/536,562

(22) Filed: Mar. 28, 2000

Related U.S. Application Data (63) Continuation-in-part of application No. 09/435,533, filed on Nov. 5, 1999, now abandoned.

(51) Int. Cl.[7] .................. G01R 27/26; G01R 31/302
(52) U.S. Cl. ........................... 324/658; 324/750
(58) Field of Search ............... 76/11; 324/458, 324/690, 658, 669, 611, 750; 379/21

(56) References Cited

U.S. PATENT DOCUMENTS

| | | | |
|---|---|---|---|
| 3,593,128 A | 7/1971 | Perry | 324/666 |
| 3,729,675 A | 4/1973 | Vosteen | 324/72 |
| 3,801,902 A | 4/1974 | Horowitz | 324/663 |
| 3,812,424 A | 5/1974 | Abbe | 324/688 |
| 3,852,667 A | 12/1974 | Williams et al. | 324/72 |
| 4,027,240 A | 5/1977 | Meade | 324/170 |
| 4,061,983 A | 12/1977 | Suzuki | 330/207 P |
| 4,149,119 A | 4/1979 | Buchheit | 324/458 |
| 4,330,749 A | 5/1982 | Eda et al. | 324/457 |
| 4,370,616 A | 1/1983 | Williams | 324/458 |
| 4,757,252 A | 7/1988 | Maltby et al. | 324/667 |
| 4,766,368 A | 8/1988 | Cox | 324/688 |
| 4,797,620 A | 1/1989 | Williams | 324/458 |
| 4,801,866 A | 1/1989 | Wixley | 324/754 |
| 4,804,922 A | 2/1989 | Sometani et al. | 324/457 |
| 4,853,639 A | 8/1989 | Volsteen et al. | 324/457 |
| 4,868,907 A | 9/1989 | Folkins | 324/231 |
| 4,878,017 A | 10/1989 | Williams | 324/109 |
| 4,928,057 A | 5/1990 | Williams | 324/72 |
| 4,973,910 A | 11/1990 | Wilson | 324/457 |
| 4,983,907 A | 1/1991 | Crowley | 324/754 |
| 5,038,110 A | 8/1991 | Braun et al. | 324/675 |
| 5,157,708 A * | 10/1992 | Garthwaite et al. | 379/21 |
| 5,166,679 A | 11/1992 | Vranish et al. | 340/870.37 |
| 5,274,336 A * | 12/1993 | Crook et al. | 324/690 |
| 5,297,167 A * | 3/1994 | Buzbee et al. | 375/10 |
| 5,363,051 A | 11/1994 | Jenstrom et al. | 324/661 |
| 5,436,565 A | 7/1995 | Gammell | 324/679 |
| 5,442,347 A | 8/1995 | Vranish | 340/870.37 |
| 5,539,292 A | 7/1996 | Vranish | 318/568.21 |
| 5,539,323 A | 7/1996 | Davis, Jr. | 324/690 |
| 5,703,928 A * | 12/1997 | Galloway et al. | 379/21 |

* cited by examiner

*Primary Examiner*—Safet Metjahic
*Assistant Examiner*—Paresh Patel
(74) *Attorney, Agent, or Firm*—Dominic Chiantera Chuck Evans; William London

(57) ABSTRACT

A noncontact sensor detects the signal waveform of analog and digital signals transmitted individually and, alternately, in combination, in designated transmission frequency bands on a pair of conductors.

37 Claims, 5 Drawing Sheets

NONCONTACT SIGNAL ANALYZER

TECHNICAL FIELD

The present invention relates to the field of electronic signal analyzers, and more particularly to non-contact signal analyzers for detecting the presence and transmission protocol of network signals. This application is a continuation-in-part of application Ser. No. 09/435,533, filed Nov. 5, 1999, now abandoned.

BACKGROUND ART

It is known to transmit electronic voice, video, and data signals through communications networks, such as the public switched telephone network (PSTN), the internet, and private local area and wide area networks (LANs and WANs). The network communications medium may be wireline, such as coaxial cable, twisted pair, or fiber optic cable, or wireless, such as cellular or radio frequency (RF) transmission. The majority of installed networks are wireline, and the most common type wireline is unshielded, twisted pair copper wire.

In operation, the networks provide simultaneous shared access by different users, and the signals appear in both digital and analog format; often together, such as in the PSTN where they are transmitted simultaneously in different segments of the network's frequency bandwidth. Also, the different network digital devices, such as computers, telephones, and video displays, have different signal bandwidth (bit per second) requirements. They may even have different transmission and reception signal bandwidths, as in the case of internet communications or data retrieval operations, where the download data volume far exceeds the upload commands. This is accommodated by using different digital transmission protocols, such as asymmetrical digital subscriber line (ADSL) and integrated-services digital network (ISDN), which PSTN service providers use for internet communications. In summary, a single conductor pair may simultaneously carry several full duplex signal exchanges, each at different frequency bandwidth segments, with different digital signal bandwidths, and possibly combined analog and digital format.

Networks, other than LANs, are interconnected to provide out of network communications. The interconnections are provided through the use of bridges and/or routers for the internet protocol (IP) networks, and by local and central office telephone switches for the PSTN. All of the interconnected network signal traffic flows through these switch points. Since it is necessary to monitor network signal traffic to determine performance trends or to isolate and repair failures, it is necessary for both IP network and telephone technicians to determine the presence of a particular signal format (analog or digital) on a line, as well as to monitor the quality of the signal. This quality monitoring includes auditing both the tonal quality of audio transmissions as well as the transmission fidelity of a particular digital protocol. Network quality standards, such as the BELLCORE standards for the PSTN, require that the monitoring and fault isolation occur with minimum signal disruption. Ideally, therefore, the tools used by the technician must be both efficient in locating the signal, and non-disruptive of signal traffic.

The prior art discloses various types of signal analyzers which determine the presence and transmission protocol of network signals. The manner in which these analyzers access the network signals varies. Some are invasive in that the sensor makes physical electrical contact with the conductor pairs by piercing the wire insulation with pointed probes. One such type used by telephone network technicians is referred to as a "bed of nails" in that it includes a number of fixture mounted probes which engage and make physical contact with the conductor wires. This physical contact creates signal noise which may manifest itself to the network user as audible sounds in the case of audio signal transmission or which may result in noise interference sufficient to interrupt and terminate a digital signal transmission. While audible interference may be annoying, the termination of a digital transmission and resulting loss of data may have much greater consequences.

There are also prior art non-contact sensors which inductively couple the transmission signal from the conductor pair, avoiding the problems resulting from physical connection. The inductively coupled sensors, however, also have disadvantages. One disadvantage is its limited signal sensitivity. These are current sensitive devices which are appropriate for use in detecting high current signals, but have limited use in low power signal detection such as is the case with network and telephone signals. A second disadvantage is the back electromagnetic force (emf) generated by the pick-up inductor (or coil) into the signal stream. This appears as noise on the line, which has the possibility of disrupting the signal or distorting its waveshape.

There is, therefore, a need for a non-invasive signal detector capable of providing high signal resolution coupling of low power (low level) line signals without interfering with the signal's transmission.

DISCLOSURE OF INVENTION

One object of the present invention is to provide a signal sensor capable of the detection of analog and/or digital signal transmissions over a conductor without perceptible affect to the signal quality and without disrupting the transmission integrity. A further object of the present invention is to provide a sensor capable of providing high fidelity signal capture without the need to make physical contact with the transmission carrying conductor. A still further object of the present invention is to provide a non-contacting, high fidelity sensor which is capable of performing signal capture of a variety of different digital signal protocols, as may be required for use in conjunction with various model protocol analyzers. A still further object of the present invention is to provide such a non-contacting, high fidelity signal sensor in a hand-held configuration which may be easily manipulated and used by a technician.

According to the present invention, a non-contact sensor includes a capacitive probe having at least one electrically conductive plate which, when placed in proximity to a signal carrying conductor, capacitively couples a sample of the signal transmitted on the conductor to analyzer circuitry which identifies the sampled signal format. In further accord with the present invention, the signal sensor includes signal conditioning circuitry, which is intermediate to the conductive plate and the signal analyzer circuitry, to provide a high impedance termination to the capacitively coupled sample signal and a low sample signal source impedance to the signal analyzer circuitry, thereby providing the sensor with a high degree of signal sensitivity.

In still further accord with the present invention, the signal sensor includes an electrically conductive shield which is placed proximate to, but spaced apart from, the conductive plate, the conductive shield being electrically connected to the signal output of the signal conditioning circuitry so as to maintain the shield at substantially the same voltage potential as that of the conductive plate, thereby shielding the plate from environmental electrostatic effects to further enhance the sensor signal sensitivity. In yet still further accord with the present invention, the sensor includes a capacitive probe having first and second electrically conductive plates, each adapted for placement in proximity to an associated one of a pair of signal conductors to capacitively couple a sample of the associated conductor transmitted signal, the sensor further including differential signal conditioning circuitry for providing an output signal to the analyzer circuitry which is proportional to the difference sum of the first and second plate coupled signals, thereby further increasing the sensor signal to noise ratio. In yet still further accord with the present invention, the size and geometry of the probe conductive plates are selectable, and are not limited to planar devices, but may themselves comprise wire conductors.

The sensor of the present invention may be provided in either a single plate sensor configuration and a double plate sensor configuration. The double plate configuration permits use of differential mode signal detection and conditioning, thereby rejecting common mode noise present in the single plate configuration, and providing a higher degree of signal fidelity as well as higher signal to noise ratio. However, the single plate configuration provides a suitable degree of detection accuracy and signal fidelity for both analog and digital signal formats, but at a lower signal to noise ratio. Because this embodiment does not require two sensors, the differential signal conditioning circuitry is not required, resulting in overall lower cost.

The conductive plates, whether in the single or double plate embodiment, are shielded from stray electrostatic effects by conductive shields placed in spatial proximity to each plate. The shields are maintained at substantially the same voltage potential as that of the conductive plates to minimize any capacitive effect resulting from their spatial proximity. The electrical connection of the shields to the low output impedance of the signal conditioning circuitry also routes incident noise to signal ground; away from the plates. In addition, the electrical signal path, e.g. the printed circuit board (PCB) conductive trace, from the plate to the signal conditioning circuitry may also be shielded from stray effects by a "trace shield". The trace shield is deposited on the PCB, between the signal carrying trace and the signal conditioning circuitry, and is electrically connected to the electrostatic shield. It is, therefore, at the same voltage potential and has the same low impedance signal return as the shield, and its effect is to prevent current leakage through the PCB, from the signal trace to the signal conditioning circuitry, thereby maintaining the sensed signal strength.

The sensor's analyzer circuitry is capable of detecting both analog and digital signals over a wide frequency range and among several digital signal protocols. These include about 300 Hz to about 3200 Hz for analog voice signals, about 25 KHz to about 1100 KHz for ADSL, about 28 KHz to about 772 KHz for T 1 signals, and about 28 KHz to about 1,024 KHz for E 1 signals (the European equivalent standard for T1), or an overall sensor bandwidth of 1100 kHz.

These and other objects, features, and advantages of the present invention will become more apparent in light of the following detailed description of a best mode embodiment thereof, as illustrated in the accompanying Drawing.

BEST MODE FOR CARRYING OUT THE INVENTION

Figure 1:
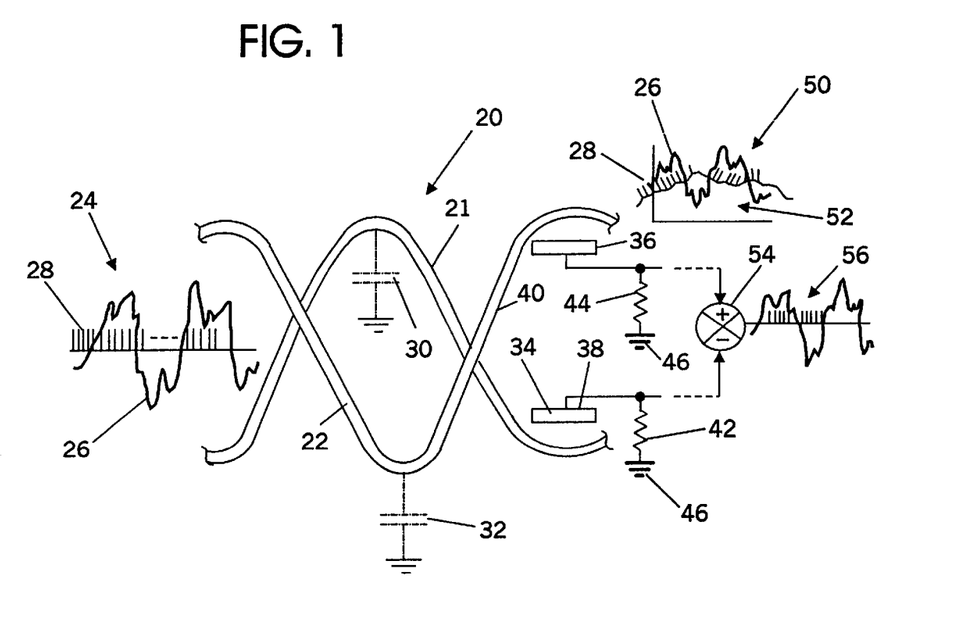
FIG. 1, is figurative illustration used in the description of the principal of operation of the present invention.

The non-contact single analyzer of the present invention provides non-invasive sampling of electrical signals transmitted on a conductor pair by coupling the signal from the conductor with a capacitive sensor. FIG. 1 is a figurative illustration of the concept. An unshielded conductor pair 20 comprises a twisted pair of insulated copper conductors 21, 22 having a wire size in the range of 24–28 AWG. The conductor pair 20 is of a type used in PSTN telephone installations for the differential transmission of analog and digital signals, such as that shown figuratively by signal waveform 24, which includes an audio analog signal 26 and a digital signal in the form of a bit stream 28.

The peak-to-peak voltage of the differential signal is less than five volts, and is typically on the order of two volts due to the wireline resistance as well as stray parasitic capacitance along the length of the wire pair. In FIG. 1 the stray parasitic capacitance is represented as the lumped capacitance's 30, 32 which are shown in phantom. The conductor (wireline) resistance in combination with the parasitic capacitance's provides a low pass frequency filter which establishes the frequency bandwidth of the conductor pair.

If one or more electrically conductive plates, 34, 36 are placed in proximity to the conductors 21, 22, the individual plates and its associated conductor, in combination, form a capacitor. These are air dielectric capacitances which provide a signal transmission path from the individual conductors 21, 22 of the conductor pair 20 onto lines 38, 40, respectively. The plate location must be in proximity to the conductors, but is not are not limited to placement between them as shown in the illustration. Similarly, it should also be understood that the term conductive plate is used in the vernacular to describe their capacitive function, and does not assume that they are limited to a planar device or to any specific geometry. Their geometry and size are selectable, and they themselves may even comprise wire conductors.

If the lines 38, 40 are connected through resistive impedances 42, 44 to signal ground 46, there is a closed signal path through the parasitic capacitance's 30, 32 back to the signal conductors, 21, 22. The individual voltage signals coupled by the plates 34, 36 and developed across the resistors 42, 44 are single ended, i.e. non-differential, such that the signal intelligence on the conductor pair 20 in the form of the analog and digital signals 26, 28 appear on lines 38, 40 biased by a carrier signal comprising whatever quiescent voltage potential signal may be present on each conductor

21, 22. This carrier signal is illustrated by the waveform 50, which includes a carrier signal 52 that is modulated by the analog and digital wave forms 26, 28. Alternatively, the signals on lines 38, 40 may be presented to a summing junction 54 which sums the two signals, thereby canceling the quiescent signal potential 52 common to both conductors and restoring the differential format, as shown in wave form 56.

Figure 2:
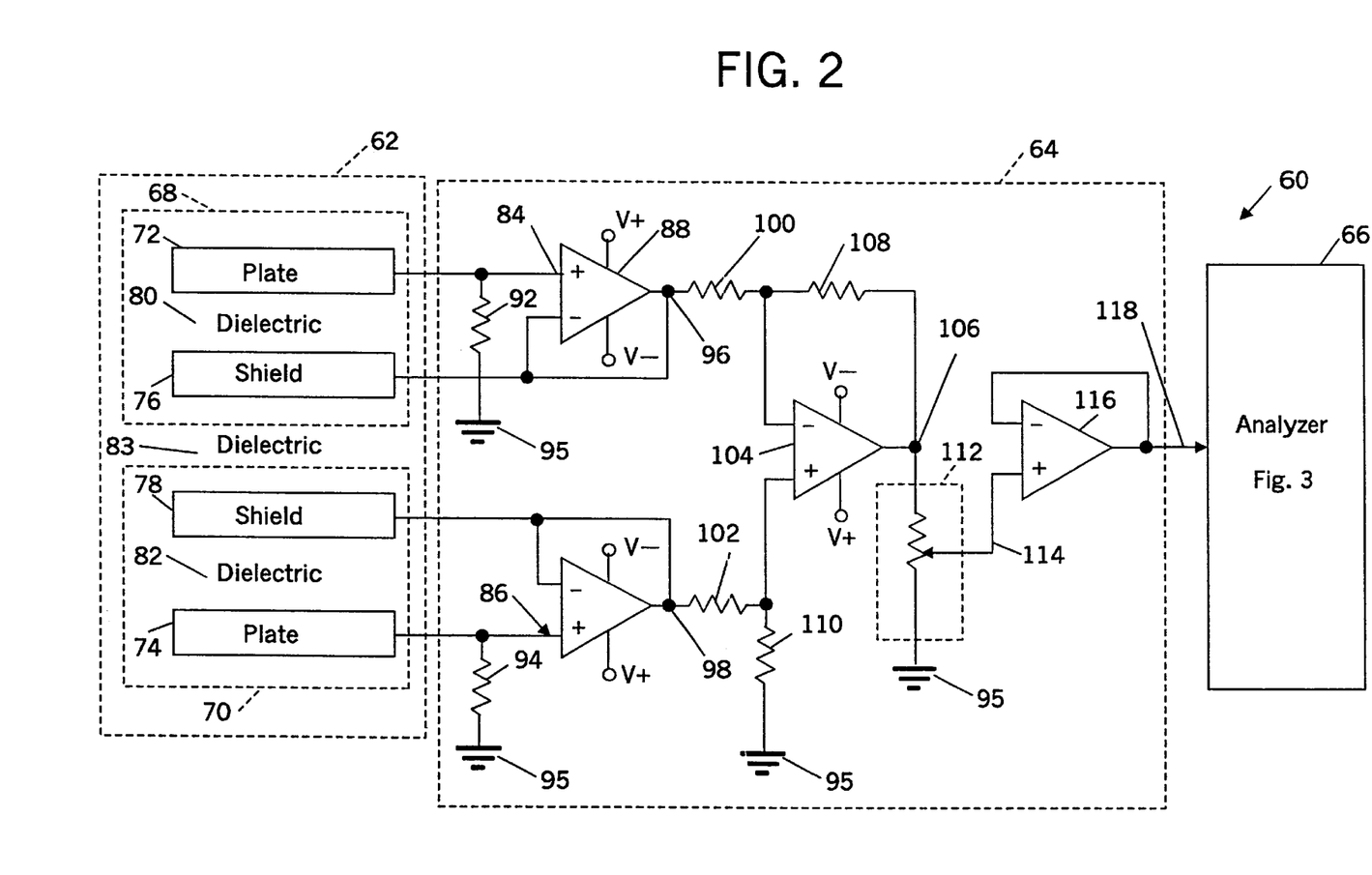
FIG. 2, is a schematic block diagram of a best mode embodiment of the non-contact signal analyzer of the present invention.

The present invention is based on this capacitive coupling principal, and is schematically shown in a best mode embodiment in FIG. 2, Referring now to FIG. 2, a non-contact signal analyzer 60 comprises a signal sensor 62, a signal conditioner 64, and a signal analyzer 66. In a best mode embodiment, the signal sensor 62 includes two signal probes 68, 70, each of which are in the form of electrically conductive capacitive plates 72, 74 that are separated from accompanying electrically conductive shields 76, 78, by non-conductive material layers 80, 82. As described hereinafter, in a best mode embodiment, the capacitive plates 72, 74 and shields 76, 78 are the same material, which is preferably copper. The two signal probes 68, 70 are physically arranged such that the shields 76, 78 are adjacent, but separated by a layer of non-conductive material 83.

The capacitive plates 72, 74 are each electrically terminated in a load impedance which, in the best mode embodiment, is the equivalent of the input impedance of the non-inverting (+) inputs 84, 86 of operational amplifiers 88, 90, in parallel with shunt resistors 92, 94; which are connected to signal ground 95. The amplifiers 88, 90 are of a known type, such as the Model OPA2340 or OPA4340 Operational Amplifiers manufactured and sold by BURR-BROWN under their MicroAmplifier™ [1] Series. As known, operational amplifiers are active amplifiers with a high open loop gain which may be operated in a closed loop configuration to established a desired proportional gain transfer function. Two of the governing characteristics of the referenced model operational amplifiers which are important in this sensor application are their bandwidth and their high common mode input impedance. Other models and makes of operational amplifiers which are known to those skilled in the art to have the same or higher bandwidth and common mode input impedance may also be used. In the present embodiment each of the amplifiers 88, 90 are configured as closed loop, unity gain, voltage followers which provide, at their outputs 96, 98, a common polarity, unity gain equivalent of the respective voltages appearing on the capacitor plates 72, 74.

[1]MicroAmplifier is a trademark of the Burr-Brown Company.

To maximize the signal sensitivity of the coupling capacitance created by the plates 72, 74 in combination with the wire pair conductors (21, 22, FIG. 1), as well as minimize the effect of this coupling capacitance on the overall bandwidth of the conductor pair, it is desirable to maximize the plate termination impedance. As described above, the termination impedance is the equivalent of the input impedance of the buffer operational amplifiers 88, 90 in parallel with the shunt resistors 92, 94. The common mode input impedance of the amplifiers is in the range of teraohms ($10^{12}$), and for all practical purposes is infinite. Therefore, the shunt resistor value establishes the termination impedance value.

In the best mode embodiment the shunt resistors are of a carbon type with a preferred range of values from 1.0 to 2.0 Giga-ohms, and a nominal value of 1.5 Giga-ohms ($1.5 \times 10^9$ ohms). The value of the coupling capacitance formed by an individual plate and its associated conductor is limited by the cross sectional area of the conductor wire that is in registration with the plate, and is on the order of less than one picofarad ($1 \times 10^{-12}$ farad) for 22–24 AWG sized wire. The combination coupling capacitance and series resistance form a high pass frequency filter, with a nominal −3 db frequency on the order of 106 Hz, which provides a degree of attenuation at 60 HZ while passing signal frequencies in the 300 Hz to 3200 Hz PSTN audio signal band.

The electrically conductive shields 76, 78 provide a degree of isolation of the capacitor plates 72, 74 from the effects of ambient radio frequency (RF) energy or other environmental electrostatic effects, thereby enhancing the signal sensitivity of the coupling capacitance's formed by the plates 72, 74 and wire pair conductors. To maximize the shielding effect the shields 76, 78 are maintained at substantially the same voltage potential as their associated plates by connecting them to the output of the related one of the operational amplifiers 88, 90. Since, as known, the output impedance of the operational amplifiers is substantially zero, the shields are substantially immune from induced electrostatic effects, and the fast response of the amplifiers permits the shield voltage to near instantly track that of the associated plate, so as to minimize the capacitive effects of the shield/plate combination by minimizing the differential electric field between them. The shields 76, 78 also prevent the voltage potential on their associated plates from affecting the other plate, since the shields have the same voltage as their related plate but are at a much lower impedance through connection to the output of their associated buffer amplifier 88, 90.

The plate voltages at the output of amplifiers 88, 90 are presented through resistors 100, 102, respectively to the dual inputs of operational amplifier 104. The amplifier, which may be the same or equivalent type to that of amplifiers 88, 90 is configured to function as a closed loop differential amplifier, and provides the differential equivalent of the two plate voltages at its output 106. As known, in the differential mode the amplifier 104 presents an equal gain transfer function to each of the two plate voltages at the outputs 96, 98 of amplifiers 88, 90. This is achieved by making the resistance value of series resistor 100 equal to that of series resistor 102 (i.e. $R_{100}=R_{102}$) and by making the amplifier's feedback resistor 108 equal to the shunt resistor 110 (i.e. $R_{108}=R_{110}$). The closed loop gain for the plate voltage at amplifier output 96 is then the ratio of feedback resistor 108 to the series resistor 100 and the gain for the plate voltage at amplifier output 98 is the same. The actual closed loop gain value is selectable, based on the desired signal sensitivity and desired voltage scale factor, and is nominally in the range of 1.0–2.0 v/v.

The difference voltage signal at the output 106 of amplifier 104 is the differential sum of the individual conductor (21, 22, FIG. 1) voltages, and all common ambient induced voltages, or noise signal that are present on each conductor, such as 60 Hz electrical power effects (e.g. the ambient noise waveform 52 of FIG. 1), is canceled, and the signal at output 106 is substantially the voice, video and/or data signal content that is transmitted through the monitored conductor pair. Although not required, it may be desirable to provide for operator adjustment of the output signal amplitude in instances where the sensor detects and monitors audio signals. To provide this adjustment capability the amplifier output is connected to the input of a signal sensitivity adjuster 112, in the form of a potentiometer with a maximum resistance of 5 K ohms, the other end of which is connected to signal ground 95.

The adjustable amplitude, differential signal is provided at the wiper output 114 of the potentiometer 112, and presented through buffer amplifier 116 to the signal output 118 of the signal conditioner stage 64. The amplifier 116 is the same or equivalent type to that of amplifiers 88, 90 and 104 and is again configured as a voltage follower, similar to that of amplifiers 88, 90, to provide a unity gain, common polarity equivalent of the differential signal on the line 118. The buffer amplifier also provides a substantially zero output impedance, which is preferred to the finite impedance provided by the potentiometer 112 at the wiper output 114, thereby approximating an ideal voltage signal source to the signal analyzer stage 66.

The differential output voltage on line 118 from the signal conditioner 64 is presented to the analyzer circuitry 66. The analyzer circuitry 66 detects which of either or both analog and digital signals are present in the sampled signal. Since the illustrated best mode embodiment of the sensor is for use in connection with the detection of PSTN signal traffic, and the PSTN analog and digital signals are banded within specific frequency ranges, the analyzer 66 relies on frequency filtering of the sampled signal to identify a given analog or digital format on the basis of the signal frequency being within the PSTN assigned analog signal or digital signal frequency band. While this may be in the nature of a qualitative analysis in that it does not distinguish digital protocol, the present sensor maintains the fidelity of the sampled signal to permit quantitative analysis of the protocol, as described hereinafter.

The analog voice signals, which are at frequencies in the range of about 300 Hz to about 3200 Hz. The digital T-1 protocol signals operate from about 28 KHz to about 772 KHz, with the actual operating frequency being dependent on the given bit pattern in the transmitted data. The operating frequencies of the ADSL and ISDN protocols overlap, with ISDN operating at frequencies up to about 100 KHz while ADSL use the frequency range of 25 KHz to about 1100 KHz for transmissions from the local PSTN switch to the individual subscriber, and 25 KHz to about 200 KHz for subscriber transmission to the switch. Finally, the European version of T 1 (i.e. E 1) operates in the frequency range of about 28 KHz to about 1,024 KHZ. Therefore, the collective frequency range for the digital signal transmissions is 25 KHz to 1100 KHz Referring now to FIG. 3, in a schematic block diagram of the analyzer 66, the differential signal on line 118 is presented to a low frequency bandpass filter 120 and a high frequency bandpass filter 122. The filters 120, 122 are active, two pole bandpass filters, of a known type, such as Sallan-Key designed filters, however, any of a number of alternative design filters may be used as deemed suitable by those skilled in the art. The lower and upper −3 db breakpoints for the low bandpass filter 120 are approximately 300 Hz and 3200 Hz, respectively, to accommodate the PSTN audio frequency range of 300 Hz to 3200 Hz. In the best mode embodiment the −3 db points for the high bandpass filter 122 are approximately 25 KHz and 1100 KHz to accommodate the collective digital signal frequency range.

Figure 3:
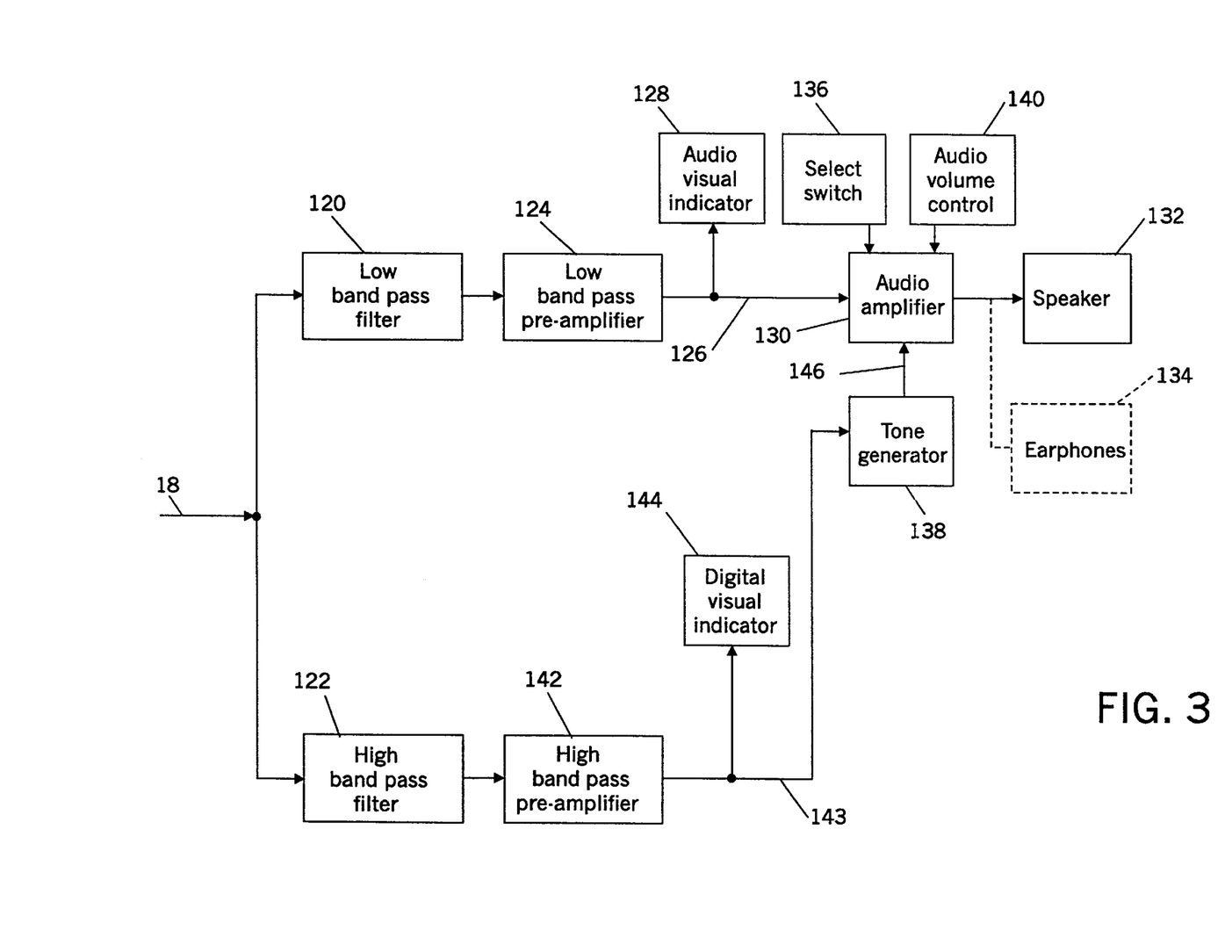
FIG. 3, is a schematic block diagram of one of the elements of the embodiment of FIG. 2.

As may be evident, the bandpass frequency range of each of the filters 120, 122 are established to pass signal frequencies within their designated operating signal band and to reject signal frequencies outside of their assigned operating band. As an example, in the described embodiment the lower −3 db point of the high bandpass filter need only be high enough to reject signals within the audio range and the upper −3 db point need only be high enough to pass the higher frequency digital signals. However, setting the lower −3 db point at 25 KHz provides a desired level of signal attenuation to the 60 Hz power line frequency, and for the PSTN application there is no practical reason for setting the upper −3 db point higher than the top end of the designated digital signal frequency band.

A signal frequency in the range of 300 to 3200 Hz passes through the low bandpass filter 120 and is blocked by the high bandpass filter 122. The output signal from the filter 120 is amplified by a low bandpass audio pre-amplifier 124 and presented on line 126 to a visual indicator 128, such as a light emitting diode, and to an audio amplifier 130. The audio amplifier 130 and pre-amp 124 are of known type circuit configurations. In the best mode embodiment the amplifier 130 provides the enhanced audio signal to a speaker 132, which may be built into the sensor analyzer housing, as described hereinafter with respect to FIG. 5 and alternately, or simultaneously, to optional earphones 134. A selector switch 136 allows an operator to select either the audio signal from the amplifier 130 or a tone signal generated by a tone generator 138 to be played through the speaker 132 or earphones 134. An audio volume control 140 is provided to permit adjustment of the speaker 132 and earphone 134 volume.

Alternatively digital signals pass through the high bandpass filter 122 but are blocked by low bandpass filter 120. The passed signal is identified as a "digital signal" and amplified by a digital pre-amplifier 142. The amplified signal is provided on line 143 and presented simultaneously to a digital signal visual indicator 144, such as an LED, and to the tone generator 138. The tone generator 138 responds to receipt of the digital signal waveform by providing an audible tone on line 146 to the audio amplifier 130. This tone, in the event the selector 136 is in the "Digital" position, is passed to the speaker 132.

As is evident the sensor provides the user with both visual and audible signal indications of the presence of either or both of the audio signal and digital signals. While the visual indicators are always enabled, such that either one or both may be illuminated at any given time in the simultaneous presence of audio and digital signals, the audible annunciation is preferred to be limited to one or the other, and is selectable by the user. Alternatively, it may be preferred to permit selection of both the actual audio signal and the tone generator signal, simultaneously, as in the case of the visual indication, which would allow the user further discretion in how the indications are provided, so as to provide for different user modalities.

While differential sampling and signal conditioning of the sample transmitted signals benefit from common mode noise rejection and improved signal to noise ratio, it is possible, and may be desirable, to use the sensor as a common mode device. The common mode embodiment is a single plate configuration which provides a suitable degree of detection accuracy and signal fidelity for both analog and digital signal fornats, but at a lower signal to noise ratio. Since the common mode eliminates one plate as well as a differential amplifier stage, it is a lower cost sensor.

Figure 4:
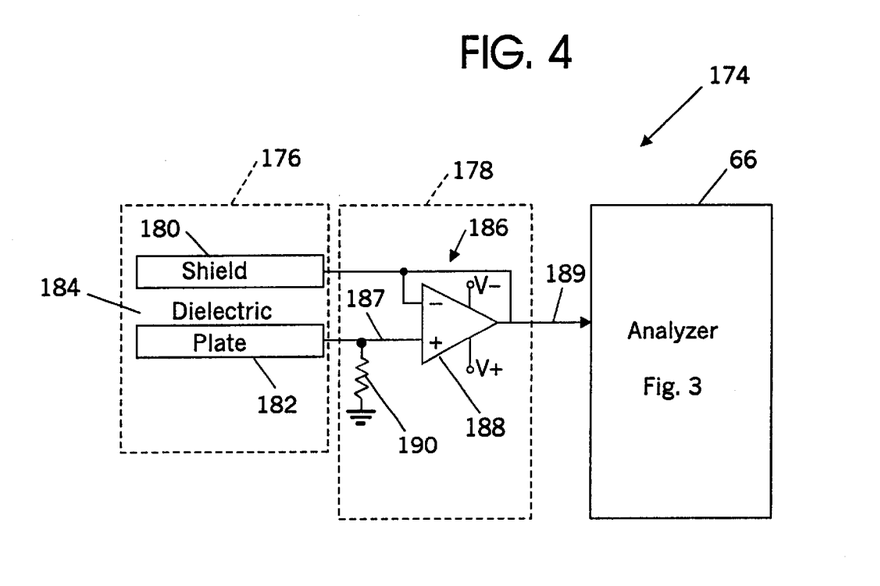
FIG. 4, is a schematic block diagram of an alternative embodiment to that of FIG. 2.

FIG. 4 is a schematic illustration of a common mode embodiment for a non-contact signal analyzer 174 having a new sensor probe 176, a new signal conditioner 178, and the same signal analyzer 66 shown in FIG. 3. The sensor probe 176 includes one conductive plate 180 which is spaced from an accompanying electrically conductive shield 182 by a non-conductive material layers 184. As in the differential embodiment the capacitive plate 180 and shield 182 are the same material; preferably copper.

The signal conditioner 178 includes a single operational amplifier 186, which is again of a known type, such as the Model OPA2340 or OPA4340 Operational Amplifiers manufactured and sold by BURR-BROWN. As described hereinbefore in relation to the dual plate configuration embodiment of FIG. 2, this make and model operational amplifier provides the necessary high common mode input impedance and bandwidth for this application, however, other make and model amplifiers which are known to those skilled in the art to have the same or higher operating characteristics may also be used.

The amplifier 186 is configured as a closed loop, unity gain voltage follower, which receives the sensed signal from the plate 182 on signal line 187 at the amplifier's non-inverting input 188, to provide a common polarity, unity gain equivalent of the plate signal voltage at output 188. As described hereinbefore in reference to the differential sensor embodiment the plate termination impedance is the parallel equivalent of the amplifier common mode input impedance, which is in the range of teraohms ($10^{12}$), and the impedance of shunt resistor 190. Since the amplifier input impedance is essentially infinite the shunt resistor establishes the termination impedance value, and in a best mode embodiment the shunt resistors are of a carbon type with a value in the range of 1.0 to 2.0 Giga-ohms, and a nominal value of 1.5 Giga-ohms ($1.5 \times 10^9$ ohms).

The value of the coupling capacitance formed by an individual plate and its associated conductor is limited by the cross sectional area of the conductor wire that is in registration with the plate, and is on the order of less than one picofarad ($1 \times 10^{-12}$ farad) for 22–24 AWG sized wire. The combination coupling capacitance and series resistance provides a high pass frequency filter, with a nominal −3 db frequency on the order of 106 Hz.

The electrically conductive shield 180 performs the same function as in the dual plate sensor to isolate the single plate 182 from environmental electrostatic effects. To maximize its effect the shield 180 is connected to the output 188 of the voltage follower amplifier 186 so as to be maintained at substantially the same voltage potential as the plate 182. This minimizes the capacitive effects of the shield/plate combination by minimizing the differential electric field between them. Similarly, the low output impedance of the amplifier 186 substantially immunizes the shield from induced electrostatic effects.

Figure 5:
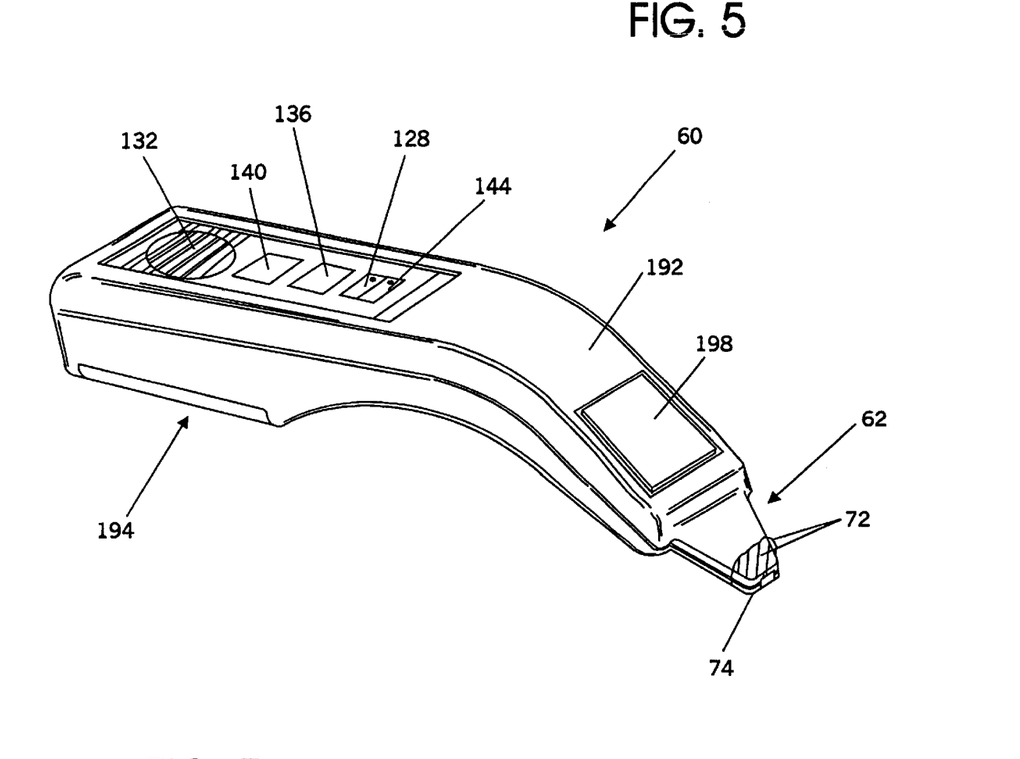
FIG. 5, is a perspective illustration of one physical embodiment of a housing which may be used in conjunction with the non-contact sensor analyzer embodiment of FIG. 2.

FIG. 5 is a perspective illustration of the external housing of a non-contact sensor analyzer in which common reference numerals are used to identify common elements described herein in connection with other figures. Referring now to FIG. 5, the non-contact sensor analyzer 60 (FIG. 2) includes a housing 192 which is preferably of a known type, electrically non-conducting material, such as ABS Plastic. The housing 192 includes a handle portion 194 which is adapted to be handheld by the user and the sensor probe 62 (FIG. 2) located at the distal end. The housing also includes a control panel area 196 in which the audio speaker 132 (FIG. 3) is mounted together with the user controls, including the analog visual indicator 128 (FIG. 3), the select switch 136 (FIG. 3), the volume control 140 (FIG. 3) and the digital visual indicator 144 (FIG. 3). A nameplate area 198 identifies the manufacturer and model type. A portion of the sensor probe 62 is broken away to illustrate the relative positioning of the probe's conductive plates 72, 74.

In the best mode embodiment the diameter of the speaker 132 is approximately 1.5 inches, and the cyclic displacement of its diaphragm when providing the audible tone and voice signals induces a mechanical vibration in the sensor housing 192. The housing vibrates at a frequency substantially equal to the audio frequency, displacing the conductive plate from its associated wire and producing a corresponding cyclic change in the sensor's coupling capacitance. This has the effect of modulating the sensed signal at the audio frequency and with little phase shift between the modulation signal and the speaker audio signal a positive feedback signal condition may result, producing "speaker squeal".

To eliminate this the speaker 132 is mechanically isolated from the housing 192 through the use of a resilient material mounting gasket that is fitted between the speaker rim and the housing surface. The vibration effect is further minimized by encapsulating the sensor's electronic circuit boards within the housing in a resilient material coating, such as a low durameter urethane, to mechanically dampen the circuit board vibrations. Other methods may include electronically delaying the sample signal to the speaker to phase displace the speaker audio from the sample signal audio at the conductive plates, or more simply by the use of earphones.

The vibratory movement of the housing may also result in a feedback condition associated with static charge build-up due to tribocharging of the housing. This static charge cyclically changes at the vibration (audio) frequency, again introducing the possibility of a positive feedback state. The tribocharging may be prevented by the use of an "antistat" topical agent which is applied to the housing surface, particularly in the area of the probe, to prevent the transfer and buildup of static charge. These antistat agents are well known in the art, and are typically surfactants, such as quaternary ammonium salts or tertiary amines that are diluted and dispersed in water or alcohol. The surfactants also remove surface dirt buildup, which helps minimize the tribocharging effect and the possibility of a positive feedback condition. In the preferred embodiment a quaternary ammonium chloride, such as MARKSTAT AL-22 is diluted to approximately 50% in isopropanol. The same result may be achieved by making the case slightly conductive, in the range of 10\6 to 10\10 ohms. A similar result may be accomplished by adding conductive particles such as carbon to the plastic. The use of an air ionizer may also solve this problem.

As described hereinbefore, the shields 76, 78 (FIG. 2) for the two plate sensor, and 180 (FIG. 4) for the single plate sensor, are connected to the signal outputs of the associated buffer amplifiers to provide them with a low termination impedance and to place them at substantially the same signal potential as their respective plates. The low termination impedance provides a "ground shield" to isolate the plate from local electrostatic effects and the equal signal potential minimizes leakage of the sensed signal current through the capacitance formed between the plate and shield. Each of these shield functions enhance the sensor's signal sensitivity.

Figure 6:
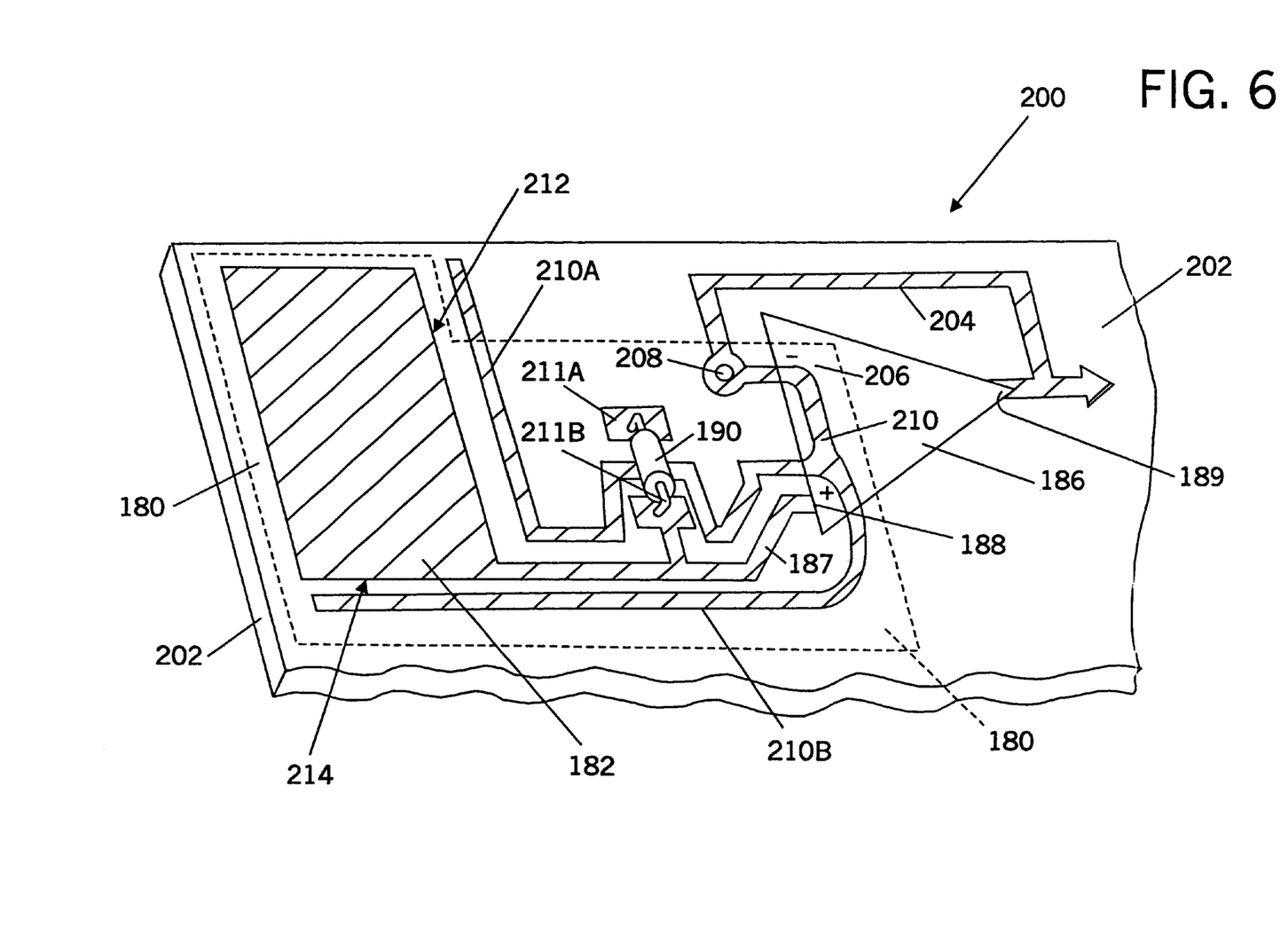
FIG. 6, is a somewhat figurative, somewhat perspective illustration of a partial printed circuit board layout which is used in connection with the description of the sensor embodiment of FIG. 2.

Due to the high termination impedance of the plates into the shunt resistors (92, 94 in FIG. 2 and 190 in FIG. 4) it is also desirable to electrically shield the signal line between the plate and the buffer amplifier input. While electrostatic shielding of the signal line is important a greater concern is current leakage of the sensed signal through the material of the substrate on which the circuit components are mounted, such as a fiberglass material printed circuit board (PCB), or such other material substrate, including ceramic. FIG. 6 is a somewhat figurative, somewhat perspective illustration of a portion 200 of a typical PCB layout of the single plate sensor embodiment of FIG. 4, in which the elements common to FIGS. 4 and 6 have the same reference numerals.

In FIG. 6 the shield 180 and the conductive plate 182 are deposited on opposite sides of a PCB 202. The conductive plate as well as the various conductive traces deposited on the visible surface of the PCB are shown in a cross hatch pattern to facilitate their description. The signal line trace 187 connects the plate 182 to the non-inverting signal input 188 of the buffer amplifier 186. The amplifier output 189 is connected by feedback trace 204 to its inverting input 206 and to a plated through hole 208 to the shield 180 on the reverse side of the PCB. Also connected at the hole 208 is a trace shield 210 which runs beneath the footprint of the amplifier 186 and, in the embodiment of FIG. 6, divides into branches 210A and 210B that are deposited on either side of the signal trace 187. In this embodiment pads 211A and 211B are provided to allow the branch trace shield 210A to cross the signal trace connection to the shunt resistor 190.

The branched trace shields 210A, 210B are placed adjacent to the signal trace 187 and along the sides 212, 214 of the plate 182 that face the interior of the PCB 202. The trace shields are at substantially the same voltage potential as the plate and signal trace such as to provide an effective zero voltage potential field along the sides 212, 214 of the plate and along the run length of the signal trace. This prevents any current leakage that may occur due to voltage potential differences between the plate and signal trace with other electrical components on the PCB. In the layout embodiment of FIG. 6 only the plate sides 212, 214 are bordered by other PCB elements, however, if additional sides were so exposed the trace shield would also extend along those sides. Conversely, if fewer than two side are so exposed the trace shield may be reduced. As an example in FIG. 6 if the PCB 202 had no component layout opposite the plate edge 214 there would be no opportunity for current leakage from the plate or the signal trace in that direction, and the branch trace shield 210B could be removed.

As further shown in FIG. 6, the shield 180 extends beyond the footprint of the plate 182, so as to fully cover the plate, and also extends past the signal input of the amplifier 186. This is desirable to ensure that the signal input circuitry is shielded from environmental electrostatic effects and from current leakage between layers of the PCB. It is also possible, if required for the given environments in which the sensor may be used, to provide the trace shield around the shunt resistor 190. It should also be understood that the shield 180 could also lie on the surface of another circuit board below the circuit board 120 in a multi-layered board configuration (not shown).

While this description of the shield placement and the layout of the trace shield are provided in connection with the single plate embodiment of FIG. 4, it is understood that the same shielding is provided for each of the plates in the two plate configuration of FIG. 2. In general, the better the shielding, the better the sensor probe is able to reproduce the signal coupled from the conductor to the plate. Other configurations for making the necessary electrical connections are readily apparent to those skilled in the art. Similarly, while the signal trace 187, trace shield 210, plate 182 and shield 180 comprise copper in the best mode embodiment, they may be any type of electrically conductive material; either metal or plastic loaded with conductive particles.

Figure 7:
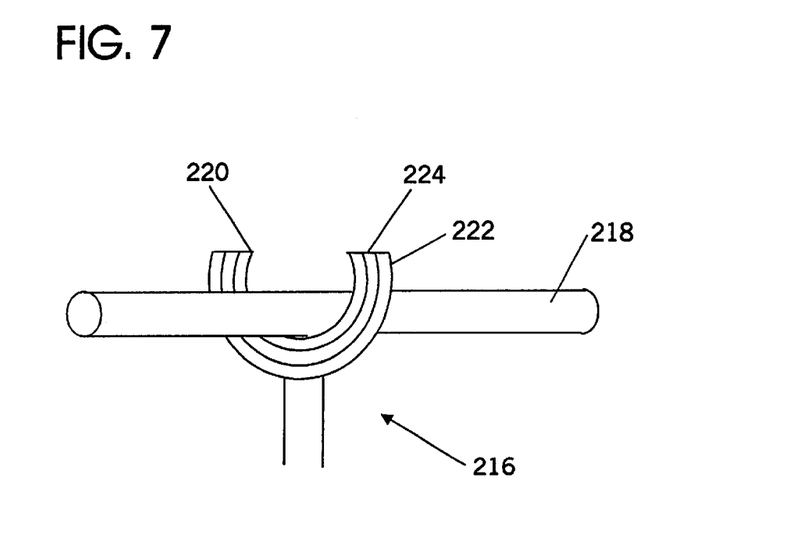
FIG. 7 is a schematic illustration of an alternative embodiment of one of the elements of the sensor embodiments of FIGS. 2 and 4.

While the description of the different sensor configurations (two plate and single plate) have assumed the use of a planar conductive plate, it may be desirable to provide the sensor with a nonplaner plate, such as that shown in FIG. 7 for the single plate probe 216 which is shaped to fit the signal conductor 218, such as a wire. The probe 216 includes a plate 220 and shield 222 separated by an insulative layer 224. The conductor 218 easily fits next to the plate 220, providing for strong signal coupling between the two. Alternatively, the plate 220, shield 222 and insulative layer 224 could be a flexible material that could be wrapped around a conductor. This material could be a thin metal such as copper for the plate 220 and the shield 222, and a flexible plastic such as polyurethane for the insulative layer 224. The probe 216 would otherwise include the same downstream signal interface with the signal conditioning circuitry as did the single plate planar probe.

The dual plate embodiment of the non-planar probe (not shown) would have two probes of the type illustrated by the probe 216 in FIG. 7, with each probe having the same downstream signal interface described in respect of the dual plate embodiment of FIG. 2. The advantage of this type non-planar probe is that the conductive plates actually cradle the wire and the capacitive coupling is therefore relatively strong. A second advantage is that the shield effectively isolates the plate from any electrical fields other that the field on the conductor, further improving sensitivity. This configuration has a disadvantage, however. It would require that each wire be handled separately. It is anticipated that this configuration would be most advantageous when the device is configured to reproduce the signal on the conductor, and not merely to identify the frequency of the signal on the conductor.

Although the invention has been shown and described with respect to a best mode embodiment thereof, it should be understood by those skilled in the art that various changes, omissions, and additions may be made to the form and detail of the disclosed embodiment without departing from the spirit and scope of the invention, as recited in the following claims.

We claim:

1. Apparatus, for detecting the signal waveforms of analog and digital signals transmitted individually and, alternately, in combination, in designated transmission frequency bands on a pair of signal conductors, comprising:

a probe having first and second electrically conductive plates for capacitively coupling first and second signal samples of the transmitted signals in each designated transmission frequency band from the signal conductors to a related one of a pair of termination impedances associated with each plate, each plate further including an associated electrically conductive shield placed in spaced relation thereto;

signal conditioning circuitry, including first and second buffer amplifiers responsive, respectively, to said first and second sample signals at said termination impedances, for providing first and second equivalent sample signals thereof at an output of each amplifier, each said equivalent sample signal having equal signal polarity and substantially equal signal magnitude as its related sample signal, said buffer amplifiers each providing said equivalent sample signal to the commonly associated one of said electrically conductive shields, whereby the voltage signal potential of the conductive shield is substantially equal to the voltage signal potential of its associated plate, said signal conditioning circuitry further including a differential signal amplifier having first and second signal inputs responsive to said first and second equivalent sample signals, respectively, for providing a differential sample signal proportional to the difference sum therebetween;

a signal analyzer, for receiving said differential sample signal at each of one or more frequency filters, each said frequency filter having a passband which passes equivalent sample signal frequencies in one of the designated transmission frequency bands and rejects all other signal frequencies, said signal analyzer further including one or more signal annunciators associated with each said frequency filter, said signal annunciators indicating the presence of a designated transmission frequency band signal passed by its associated frequency filter; and a sensor housing, for enclosing said signal conditioning circuitry and said signal analyzer within its main body and for enclosing said probe within a probe portion at one end thereof, said housing having a surface area for mounting said signal annunciators, and being adapted to be placed by a user in proximity to one or more conductors.

2. The apparatus of claim 1, wherein:

said signal analyzer provides said passed equivalent sample digital signals to an output thereof; and said sensor housing further includes signal connectors for providing user access to the passed equivalent sample digital signals for purposes of supplemental signal analysis.

3. The apparatus of claim 1, wherein each said buffer amplifier is an operational amplifier having a minimum common mode input impedance of $10^{12}$ ohms.

4. The apparatus of claim 1, wherein each said buffer amplifier receives the sample signal from its associated conductive plate at a non-inverting signal input thereof; and each said termination impedance comprises a resistor connected in parallel with said buffer amplifier common mode input impedance, from said non-inverting signal input to signal ground.

5. The apparatus of claim 1, wherein said resistor has a minimum resistance value of one giga-ohm.

6. The apparatus of claim 1, wherein said annunciators comprise visual indicators.

7. The apparatus of claim 6, wherein said visual indicators comprise light emitting diodes.

8. The apparatus of claim 1, wherein said annunciators comprise aural indicators.

9. The apparatus of claim 8, wherein said aural indicators comprise a speaker.

10. The apparatus of claim 8, wherein said aural indicators comprise earphones.

11. The apparatus of claim 1, wherein said signal annunciators associated with each said frequency filter comprises a combination of a visual indicator and an aural indicator.

12. The apparatus of claim 1, wherein said housing comprises a plastic material.

13. The apparatus of claim 1, wherein said housing surface further includes a topical coating of an antistat agent.

14. The apparatus of claim 13, wherein said antistat agent is particularly applied to the surface of the housing probe portion.

15. The apparatus of claim 13, wherein the antistat agent is a surfactant.

16. The apparatus of claim 1, wherein each said conductive plate and its associated conductive shield are substantially planar.

17. The apparatus of claim 1, wherein each said conductive plate and its associated conductive shield are substantially curvilinear to permit cradling of a wire conductor by the conductive plate.

18. A method for detecting the signal waveforms of analog and digital signals transmitted individually and, alternately, in combination, in designated transmission frequency bands on a pair of conductors, comprising:

coupling, with capacitive means, a sample signal of the transmitted signals from a conductor to a termination impedance;

conditioning the sample signal at the termination impedance to provide an equivalent sample signal in the form of a low source impedance signal;

filtering the equivalent sample signal with a plurality of alternate bandpass frequency filters, each alternate bandpass being selected to pass equivalent sample signal frequencies in a different one of the designated transmission frequency bands, and to reject all other signal frequencies;

detecting the presence of a designated transmission frequency band signal passed by a filter; and activating an annunciator to notify a user of the presence of a passed transmission frequency band signal.

19. The method of claim 18, wherein the step of coupling includes:

shielding the capacitive coupling means with a conductive shield to minimize electrostatic effects on the sample signal; and energizing the conductive shield with the equivalent sample signal to minimize current leakage effects on the sample signal.

20. The apparatus of claim 19, wherein the step of conditioning includes:

presenting the sample signal from the termination impedance to the non-inverting signal input of an operational amplifier having a minimum common mode input impedance of $10^{12}$ ohms.

21. The method of claim 20, wherein the step of coupling further includes:

providing the termination impedance as a resistor connected in parallel with the operational amplifier common mode input impedance, from said non-inverting signal input to signal ground.

22. The method of claim 21, wherein the resistor has a minimum resistance value of one giga-ohm.

23. The method of claim 19, further comprising:

using a housing to enclose the capacitive coupling means and its associated shield within a probe portion thereof, and to surface mount thereon the annunciators, and adapting the housing for placement by a user in proximity to one or more conductors.

24. The method of claim 23, further comprising:

presenting the equivalent sample digital signals to one or more output signal connectors on the housing; and facilitating user access to the passed equivalent sample digital signals at the output signal connectors for purposes of supplemental signal analysis.

25. The method of claim 23, wherein the step of activating includes:

providing the annunciators as visual indicators and, alternately, as aural indicators and, alternately, as individual visual indicators and aural indicators.

26. The method of claim 25, wherein the step of activating includes:

embodying the aural indicator as a surface mounted speaker on the housing.

27. The method of claim 26, further comprising:

applying a topical coating of an antistat agent to the surface of the housing.

28. The method of claim 27, wherein the antistat agent is particularly applied to the surface of the housing probe portion.

29. The method of claim 27, wherein the antistat agent is a surfactant.

30. Apparatus, for detecting the signal waveforms of analog and digital signals transmitted individually and, alternately, in combination, in designated transmission frequency bands on a pair of conductors, comprising:

a housing, having an axially extending main body portion and a probe portion arranged in tandem therewith, said probe portion being adapted for placement by a user in proximity to the signal conductors, said housing further having a surface area adapted for mounting signal annunciators, a substrate, adapted to be removably mounted within said housing, said substrate having mutually opposed major surfaces adapted to fit within said probe portion and said main body portion, said major surfaces being further adapted to receive thereon, in a surface mounted configuration, the components elements of:

a probe, having first and second plates disposed on opposite ones of said of mutually opposed major surfaces of said substrate, and each connected to an associated termination impedance, each said conductive plate having an associated electrically conductive shield disposed in spaced relationship therewith on said accompanying substrate major surface, said conductive plates being adapted to capacitively couple first and second signal samples of the transmitted signals in each designated transmission frequency band to said associated termination impedance in response to placement of said housing probe portion in proximity to the signal conductors; and signal conditioning circuitry, including first and second buffer amplifiers responsive, respectively, to said first and second sample signals for providing first and second equivalent sample signals thereof at an output of each amplifier, each said equivalent sample signal having equal signal polarity and substantially equal signal magnitude as its related sample signal, said buffer amplifiers each providing said equivalent sample signal to the commonly associated one of said electrically conductive shields, whereby the voltage signal potential of the conductive shield is substantially equal to the voltage signal potential of its associated plate, said signal conditioning circuitry further including a differential signal amplifier having first and second signal inputs responsive to said first and second equivalent sample signals, respectively, for providing a differential sample signal proportional to the difference sum therebetween;

wherein said substrate includes conductive material traces disposed thereon to provide signal interconnection between each said conductive plate and its associated termination resistor and buffer amplifier, and wherein the periphery of said conductive plates and the conductive material trace signal connection between each plate and its termination resistor and buffer amplifier are bounded by a co-planar trace shield having an applied voltage potential which is substantially the same as the signal voltage potential of said conductive plates, as necessary, to minimize current leakage across said substrate major surfaces, between said conductive plates and interconnecting signal traces, and other substrate mounted apparatus; and a signal analyzer, for receiving said equivalent sample signal at each of one or more frequency filters, each said frequency filter having a passband which passes equivalent sample signal frequencies in one of the designated transmission frequency bands and rejects all other signal frequencies, said signal analyzer further including one or more signal annunciators associated with each said frequency filter, said signal annunciators indicating the presence of a designated transmission frequency band signal passed by its associated frequency filter.

31. The apparatus of claim 30, wherein said substrate comprises a printed circuit board.

32. The apparatus of claim 31, wherein each said buffer amplifier is an operational amplifier having a minimum common mode input impedance of $10^{12}$ ohms.

33. The apparatus of claim 32, wherein each said buffer amplifier receives the sample signal from its associated conductive plate at a non-inverting signal input thereof; and each said termination impedance comprises a resistor connected in parallel with said buffer amplifier common mode input impedance, from said non-inverting signal input to signal ground.

34. The apparatus of claim 33, wherein said resistor has a minimum resistance value of one giga-ohm.

35. The apparatus of claim 34, wherein said resistor comprises a carbon composition resistor.

36. The apparatus of claim 30, further comprising:

a sensor housing, for enclosing said substrate with said mounted probe, signal conditioning circuitry, and said signal analyzer, said housing having a surface area for mounting said signal annunciators, and being adapted to be placed by a user in proximity to one or more conductors.

37. The apparatus of claim 36, wherein:

said signal analyzer provides said passed equivalent sample digital signals to an output thereof; and said sensor housing further includes signal connectors for providing user access to the passed equivalent sample digital signals for purposes of supplemental signal analysis.

* * * * *